United States Patent
Hatano et al.

(10) Patent No.: US 8,674,589 B2
(45) Date of Patent: Mar. 18, 2014

(54) PIEZOELECTRIC CERAMICS AND MULTI-LAYERED PIEZOELECTRIC CERAMIC COMPONENTS

(75) Inventors: Keiichi Hatano, Tokyo (JP); Hiroyuki Shimizu, Tokyo (JP); Asa Yamamoto, Tokyo (JP); Yutaka Doshida, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/542,360

(22) Filed: Jul. 5, 2012

(65) Prior Publication Data
US 2013/0162109 A1    Jun. 27, 2013

(30) Foreign Application Priority Data

Jul. 4, 2011 (JP) ................................. 2011-148201

(51) Int. Cl.
*H01L 41/187* (2006.01)
(52) U.S. Cl.
USPC .......................................................... 310/358
(58) Field of Classification Search
USPC .............. 252/62.9 R, 36.9 PZ; 310/311, 358, 310/364–368; 501/134, 335, 136
IPC ..................................................... H01L 41/187
See application file for complete search history.

(56) References Cited

U.S. PATENT DOCUMENTS

| | | | | |
|---|---|---|---|---|
| 6,093,339 A | * | 7/2000 | Kimura et al. | ............ 252/62.9 R |
| 2008/0061263 A1 | * | 3/2008 | Kawada et al. | ......... 252/62.9 PZ |
| 2008/0252179 A1 | * | 10/2008 | Kimura et al. | ................. 310/365 |

FOREIGN PATENT DOCUMENTS

| | | |
|---|---|---|
| CN | 1388089 A | 1/2003 |
| CN | 102070337 A | 5/2011 |
| JP | 2002-068835 | 3/2002 |
| JP | 2003-342069 A | 12/2003 |
| JP | 2004-244301 | 9/2004 |
| JP | 2004-300012 | 10/2004 |
| JP | 2008-207999 | 9/2008 |
| JP | 2010-052999 A | 3/2010 |
| JP | 2010-180121 | 8/2010 |
| WO | 2008/152851 A1 | 12/2008 |
| WO | 2010/128647 A1 | 11/2010 |

OTHER PUBLICATIONS

Saito, Y., et al., "Lead-free piezoceramics", Nature, vol. 432, No. 7013, pp. 84-86 (Nov. 2004).
Guo, Y., Phase transitional behavior and piezoelectric properties of (Na0.5K0.5)NbO3-LiNbO3 ceramics, vol. 85, No. 18, pp. 4121-4123 (Nov. 2004).
Japanese Office Action dated May 29, 2013 of Japanese Application No. 2011-148201 (7 pages).
First Office Action issued by the State Intellectual Property Office of the People's Republic of China in connection with Patent Application No. 201210230001.6 on Sep. 6, 2013, with English-language translation (12 pages).

* cited by examiner

*Primary Examiner* — Thomas Dougherty
*Assistant Examiner* — Karen B Addison
(74) *Attorney, Agent, or Firm* — Pillsbury Winthrop Shaw Pittman, LLP (57) ABSTRACT

A piezoelectric ceramic comprising as a main component an alkali-containing niobate-based perovskite structure expressed by a compositional formula $(Li_xNa_yK_{1-x-y})_a(Nb_{1-z}Ta_z)O_3$ (provided: $0.04 < x \leq 0.1$, $0 \leq y \leq 1$, $0 \leq z \leq 0.4$, and $0.95 \leq a \leq 1.005$); wherein a crystal phase or an amorphous phase containing Si and K is made present at a grain boundary or a grain boundary triple point of a plurality of crystal grains constituting the piezoelectric ceramic.

6 Claims, 4 Drawing Sheets

PIEZOELECTRIC CERAMICS AND MULTI-LAYERED PIEZOELECTRIC CERAMIC COMPONENTS

BACKGROUND OF THE INVENTION

1. Field of the Invention

This application claims priority from Japanese Patent Application No. 2011-148201 (filed on 4 Jul. 2011), the contents of which are incorporated entirely herein by reference.

The present invention relates to a piezoelectric ceramic having an alkali-containing niobate-based perovskite structure but free of lead and the like, and a multi-layer piezoelectric ceramic element to be obtained by laminating alternately a plurality of piezoelectric ceramic layers composed of the piezoelectric ceramic and electrodes.

2. Description of the Related Art

The principle of conversion of electrical energy to mechanical energy and mechanical energy to electrical energy (piezoelectric effect) of a piezoelectric ceramic is applied to many electronic devices. Such an electronic device utilizing the piezoelectric effect is referred to herein as a "piezoelectric device," and an electronic element with a piezoelectric ceramic to be usable in such a piezoelectric device is referred to as a "piezoelectric ceramic element."

For a piezoelectric ceramic element, a piezoelectric ceramic containing lead and composed of 2 components, such as PbTiO3-PbZrO3 (hereinafter referred to as "PZT") or a piezoelectric ceramic yielded by adding a third component, such as $Pb(Mg_{1/3}Nb_{2/3})O_3$ or $Pb(Zn_{1/3}Nb_{2/3})O_3$, to the PZT has been heretofore used. Piezoelectric ceramics containing PZT as a main component exhibit a good piezoelectric property, and are employed currently in many piezoelectric ceramic elements already in practical use. However, since piezoelectric ceramics utilizing PZT as a main component contain Pb, there has been a problem of high environmental load due to volatilization of PbO, etc. in the production process.

Consequently, lead-free or low-lead piezoelectric ceramics have been demanded. Lead-free piezoelectric ceramics have been studied recently energetically. For example, Nature, 432 (4), 2004, pp. 84-87 and Applied Physics Letters 85 (18), 2004, pp. 4121-4123 have reported that a piezoelectric ceramic having an alkali-containing niobate-based perovskite structure exhibits a piezoelectric effect equivalent to PZT. The piezoelectric ceramic contains Li, Na, K, Nb, Ta, Sb and O as main components and is expressed by a general formula $\{Li_x[Na_{1-y}K_y]_{1-x}\}_a\{Nb_{1-z-w}Ta_zSb_w\}_bO_3$ (wherein x, y, z, w, a and b mean molar fractions, and $0 \leq x \leq 0.2$, $0 \leq y \leq 1$, $0 \leq z \leq 0.4$, $0 \leq w \leq 0.2$, $0.95 \leq a$, $b \leq 1.05$). It has been commonly known that a piezoelectric ceramics expressed by the compositional formula has good piezoelectric properties, such as piezoelectric constant, and electromechanical coupling factor, (see Japanese Patent Laid-Open No. 2002-068835, Japanese Patent Laid-Open No. 2003-342069, and Japanese Patent Laid-Open No. 2004-300012).

While, a multi-layer piezoelectric ceramic element utilizing a piezoelectric ceramic expressed by the compositional formula has been under development. For example, Japanese Patent Laid-Open No. 2008-207999 discloses a multi-layer piezoelectric ceramic element, for which low temperature firing is made possible by mixing $Li_2CO_3$, $LiBO_2$, or $Li_2B_4O_7$ as a sintering agent. Further, International Publication No. WO 2008/152851 discloses a piezoelectric ceramic composition expressed by a general formula $\{(1-x)(K_{1-a-b}Na_aLi_b)(Nb_{1-c}Ta_c)O_{3-x}M2ZrO_3\}$ (provided that M2 is at least one of Ca, Ba, and Sr; x, a, b, c are respectively $0.005 \leq x \leq 0.1$, $0 \leq a \leq 0.9$, $0 \leq b \leq 0.1$, $0 \leq a+b \leq 0.9$, and $0 \leq c \leq 0.3$), wherein Mn is contained in a range of 2 to 15 mol with respect to 100 mol of the main component, and Zr is contained in a range of 0.1 to 5.0 mol with respect to 100 mol of the main component, as well as a multi-layer piezoelectric ceramic element having a piezoelectric ceramic layer formed by the piezoelectric ceramic composition.

Further, Japanese Patent Laid-Open No. 2010-180121 discloses a multi-layer piezoelectric ceramic element comprising a piezoelectric ceramic layer having a core phase and a shell phase of compositions different from each other, wherein a piezoelectric ceramic is expressed by the general formula $\{Li_x[Na_{1-y}K_y]_{1-x}\}_a\{Nb_{1-z-w}Ta_zSb_w\}O_3$ (provided: $0 \leq x \leq 0.2$, $0 \leq y \leq 1$, $0 \leq z \leq 0.4$, $0 \leq w \leq 0.2$, $x+y+z>0$, and $0.95 \leq z \leq 1$).

Further, Japanese Patent Laid-Open No. 2010-52999 discloses a piezoelectric ceramic expressed by the general formula $(1-a)[K_{1-x}Na_x]_{1-y}Li_y[Nb_{1-z-w}Ta_zSb_w]O_3 + aK_3Nb_3O_6Si_2O_7$ (provided: $0 \leq x \leq 1$, $0 \leq y < 1$, $0 \leq z < 1$, $0 \leq w < 1$, and $0.003 \leq a \leq 0.1$) as a material for a multi-layer piezoelectric ceramic element. In a piezoelectric ceramic disclosed in the same application, the average grain size of polycrystals constituting the ceramic can be suppressed to 0.8 to 3 μm. Therefore, the multi-layer piezoelectric ceramic element produced from the piezoelectric ceramic has a larger amount of crystal grains between the layers. As the result, the multi-layer piezoelectric ceramic element has a larger number of grain boundaries between the layers. Since in a piezoelectric ceramic sintered sufficiently compact, the insulation property at a grain boundary is generally superior to the intragranular insulation property, by increasing the number of grain boundaries between the layers, the resistance property can be improved. Further, the piezoelectric ceramic disclosed in the same application has good piezoelectric properties, such as an electromechanical coupling factor kp higher than 38%. The electromechanical coupling factor is an index of efficiency of conversion of electrical energy to mechanical energy.

SUMMARY OF THE INVENTION

However, all of the above described conventional multi-layer piezoelectric ceramic elements have problems as described below and are inadequate as piezoelectric ceramics replacing a piezoelectric ceramic and piezoelectric ceramic element using lead.

By a technique described in Japanese Patent Laid-Open No. 2008-207999, in which $Li_2CO_3$ as a carbonate is added during firing, the $Li_2O$ remains in a ceramic after firing and the resistance of the ceramic will be decreased. Such a ceramic is not desirable as a material for a piezoelectric device. Further, by adding a compound such as $LiBO_2$ and $Li_2B_4O_7$ during firing, the piezoelectric property of a resulted ceramic will be deteriorated. There is no description concerning a piezoelectric property in the Japanese Patent Laid-Open No. 2008-207999.

While, the electromechanical coupling factor kp (a coupling coefficient of a disk shape vibrator in a radial direction of the disk) of a multi-layer piezoelectric ceramic element in International Publication No. WO 2008/152851 is generally low with the maximum of 32.7%.

Since a multi-layer piezoelectric ceramic element in Japanese Patent Laid-Open No. 2010-180121 is sintered compact at firing temperature of 1100° C. or higher, a kind of an electrode, which can be used in a multi-layer piezoelectric ceramic, is limited.

While, simple deposition of a crystal phase of $K_3Nb_3O_6Si_2O_7$ as described in Japanese Patent Laid-Open No. 2010-52999 may not be able to improve adequately the resistance property of a multi-layer piezoelectric ceramic element. For example, if a crystal phase of $K_3Nb_3O_6Si_2O_7$ is deposited only on an outer surface of a piezoelectric ceramic, since a crystal phase of $K_3Nb_3O_6Si_2O_7$ is not present between electrodes formed inside the piezoelectric ceramic, the resistance property cannot be improved adequately.

While, with respect to a piezoelectric ceramic comprising an alkali-containing niobate-based perovskite structure, especially a piezoelectric ceramic containing Li as a main component, it is very difficult to yield a compactly sintered body. For example, Japanese Patent Laid-Open No. 2010-52999 does not describe concretely a piezoelectric ceramic comprising an alkali-containing niobate-based perovskite structure with the Li content at A-sites of higher than 4% in terms of atomic percentage. It is believed that such a piezoelectric ceramic comprising an alkali-containing niobate-based perovskite structure with the Li content of higher than 4% in terms of atomic percentage can hardly yield a compactly sintered body.

The present invention has been made in view of such problems of the prior art, with an object to provide a piezoelectric ceramic comprising an alkali-containing niobate-based perovskite structure with the Li content at A-sites of higher than 4% in terms of atomic percentage, which can be sintered compact in an approximate range of 950 to 1050° C., has a high electromechanical coupling constant and a good piezoelectric property, and is free of lead, or of low lead.

The present inventors have found that the object can be attained, if a crystal phase or an amorphous phase containing Si and K exists at a grain boundary or a grain boundary triple point of a plurality of crystal grains constituting a base substance of a piezoelectric ceramic.

The present invention has been completed based on the aforedescribed findings.

A piezoelectric ceramic according to an aspect of the present invention is a piezoelectric ceramic comprising as a main component an alkali-containing niobate-based perovskite structure expressed by a compositional formula $(Li_xNa_yK_{1-x-y})a(Nb_{1-z}Ta_z)O_3$ (provided: $0.04<x\leq0.1$, $0\leq y\leq 1$, $0\leq z\leq 0.4$, and $0.95\leq a\leq 1.005$); wherein a crystal phase or an amorphous phase containing Si and K is present at a grain boundary or a grain boundary triple point of a plurality of crystal grains constituting the piezoelectric ceramic.

With respect to a piezoelectric ceramic according to another aspect of the present invention, the composition of the crystal phase or the amorphous phase is $K_3Nb_3O_6Si_2O_7$.

With respect to a piezoelectric ceramic according to further another aspect of the present invention, the piezoelectric ceramic comprises 0.2 to 3.0 mol % (on mol basis) of $SiO_2$ and 0.1 to 1.5 mol % (on mol basis) of $Li_2O$ with respect to 100 mol % of the main component, and the ratio of ($Li_2O$ in mol)/($SiO_2$ in mol) is in a range of 0.3 to 0.7.

With respect to a piezoelectric ceramic according to further another aspect of the present invention, the piezoelectric ceramic comprises 0.0 to 2.0 mol % (on mol basis) of M2O (provided that M2 is at least one kind out of Ca, Ba, and Sr), 0.0 to 2.0 mol % (on mol basis) of $ZrO_2$, and 0.0 to 2.0 mol % (on mol basis) of MnO with respect to 100 mol % of the main component.

A piezoelectric ceramic element according to an aspect of the present invention has a piezoelectric ceramic layer comprising the aforedescribed piezoelectric ceramic, wherein an external electrode is formed on an outer surface of the piezoelectric ceramic layer.

A piezoelectric ceramic element according to another aspect of the present invention has piezoelectric ceramic layers comprising the aforedescribed piezoelectric ceramic, and a plurality of internal electrodes disposed inside the piezoelectric ceramic layers, which have been stacked on one another in the thickness direction intercalating the piezoelectric ceramic layer, wherein a plurality of external electrodes connected electrically with any of the internal electrodes are formed on an outer surface of the piezoelectric ceramic.

According to the present invention, with respect to a piezoelectric ceramic comprising an alkali-containing niobate-based perovskite structure with the Li content at A-sites of higher than 4% in terms of atomic percentage, the average grain size of crystal grains of the piezoelectric ceramic can be made 1 to 5 μm by depositing a crystal phase or an amorphous phase containing Si and K at a grain boundary or a grain boundary triple point of a plurality of crystal grains constituting the base substance of the piezoelectric ceramic. If a laminated ceramic element is produced using the piezoelectric ceramic, the laminated ceramic element can have a good piezoelectric property and a good resistance property. Further, since piezoelectric ceramics according to the respective embodiments of the present invention can be fired sufficiently compact in an approximate range of 950 to 1050° C., while enjoying a high electromechanical coupling constant and a good piezoelectric property, they can be used as a substitute material for conventional piezoelectric ceramics containing Pb as a main component.

Further, if the piezoelectric ceramics according to the respective embodiments of the present invention are used as a piezoelectric ceramic base substance of a multi-layer piezoelectric ceramic element, the same can be fired at a low temperature in an approximate of 950 to 1050° C.; and therefore an internal electrode material with Pt, Pd and Ag as a major component can be fired together.

DETAILED DESCRIPTION OF THE PREFERRED EMBODIMENTS

The piezoelectric ceramic according to the present invention will be described in detail below. A piezoelectric ceramic according to an embodiment of the present invention is represented by the following compositional formula (i):

$$100(Li_xNa_yK_{1-x-y})a(Nb_{1-z}Ta_z)O_3+\alpha Li_2O+\beta SiO_2+mM2O+nZrO_2+lMnO \quad (i)$$

In the compositional formula (i) M2 stands for at least one kind of elements out of Ca, Ba and Sr.

According to an embodiment, x, y, z, a, α, β, m, n, and l in the above formula (i) are respectively in the following ranges:

$$0.04 \leq x \leq 0.1 \quad (1)$$

$$0 \leq y \leq 0.8 \quad (2)$$

$$0 \leq x+y \leq 0.8 \quad (3)$$

$$0 \leq z \leq 0.4 \quad (4)$$

$$0.95 \leq a \leq 1.005 \quad (5)$$

$$0.2 \leq \alpha \leq 1.5 \quad (6)$$

$$0.4 \leq \beta \leq 3.0 \quad (7)$$

$$0.30 \leq \alpha/\beta \leq 0.70 \quad (8)$$

$$0 \leq m \leq 2.0 \quad (9)$$

$$0 \leq n \leq 2.0 \quad (10)$$

$$0 \leq l \leq 2.0 \quad (11)$$

Thus, a piezoelectric ceramic according to an embodiment of the present invention can be obtained by adding $Li_2O$, $SiO_2$, mM2O, $nZrO_2$, and/or MnO in the ranges expressed by (6) to (11) to 100 mol of the main component to constitute a piezoelectric ceramic having an alkali-containing niobate-based perovskite structure represented by a compositional formula $(Li_xNa_yK_{1-x-y})_a(Nb_{1-z}Ta_z)O_3$ subject to the ranges set forth in (1) to (5) above.

The reason behind that the piezoelectric ceramic represented by the above compositional formula can exert better effect than conventional piezoelectric ceramics is believed to be attributable to the following.

Figure 1:
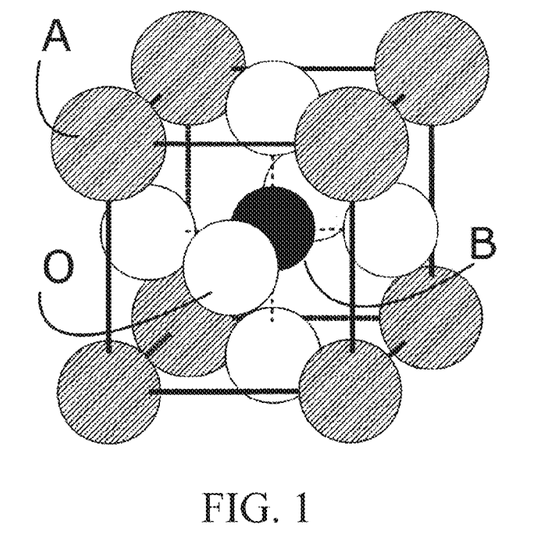
FIG. 1 is a schematic diagram showing a crystal structure of a piezoelectric ceramic having an alkali-containing niobate-based perovskite structure.

An alkali-containing niobate-based perovskite structure has an $ABO_3$-type perovskite structure, whose A-sites are occupied by an alkali metal element such as K, Na and Li and B-sites are occupied by Nb building a periodic structure. FIG. 1 is a schematic diagram showing an alkali-containing niobate-based perovskite structure. As illustrated, in an alkali-containing niobate-based perovskite structure, 6 O atoms are coordinated around a B-site and 12 O atoms are coordinated around an A-site. A crystal is formed by periodic continuation of the structure. In the case of stoichiometry of A:B=1:1, all the sites are occupied by elements and the structure becomes stable.

In a production process of a ceramic having an alkali-containing niobate-based perovskite structure, the relative contents of the components in the final product may deviate from the stoichiometric composition by several % due to various causes; namely, K, Na, and Li may be dissolved into moisture in the air, the K, Na, and Li may be vaporized during calcination, and the K, Na, and Li may be vaporized during firing. Such deviation is in general not more than 2%. For compensating such a change in the relative contents in a production process, a technique has been known, by which a source material as a supply source of K, Na, and Li is used in excess of an amount to be required for a stoichiometric composition in an initial charge. In order to assure a good piezoelectric effect of a ceramic having an alkali-containing niobate-based perovskite structure, it is desirable to make the final ratio of A-site to B-site of the ceramic in a range of 0.98<A/B<1.01.

However, if K, Na, and Li are added in a ratio higher than a stoichiometric composition, an oxide of K, Na, and Li, such as $K_2O$, $Na_2O$, and $Li_2O$, and a carbonate compound of K, Na, and Li, such as $K_2CO_3$, $Na_2CO_3$, $Li_2CO_3$, tend to be deposited. Since such an oxide and a carbonate compound can act as a conducting component in a piezoelectric ceramic, they may cause deterioration of the specific resistance of a piezoelectric ceramic. Further, due to influence of the oxide and the carbonate compound, a piezoelectric ceramic may have deliquescent tendency.

It is described in Japanese Patent Laid-Open No. 2010-52999 that the volatilization of an alkali component can be suppressed by incorporating a crystal phase of $K_3Nb_3O_6Si_2O_7$.

However experiments by the present inventors have revealed that a piezoelectric ceramic having an alkali-containing niobate-based perovskite structure, whose Li content at A-sites is higher than 4%, is quite difficult to be fired.

The present inventors have discovered that the sintering property of a piezoelectric ceramic having an alkali-containing niobate-based perovskite structure, whose Li content at A-sites is higher than 4%, can be remarkably improved by adding Li in an amount reduced to $Li_2O$ as shown in the formula (6).

Further, the present inventors have discovered that the sintering property and the piezoelectric property of a piezoelectric ceramic having an alkali-containing niobate-based perovskite structure, whose Li content at A-sites is higher than 4%, can be improved by adding Li in an amount reduced to $Li_2O$ as shown in the formula (6) and adding Si in an amount reduced to $SiO_2$ as shown in the formula (7).

The present inventors have further discovered that the sintering property and the piezoelectric property can be improved and adequate specific resistance can be obtained, if the ratio α/β of α and β in the formulas (6) and (7) is in a range of the formula (11).

Thus, a piezoelectric ceramic with an improved sintering property was obtained by adding Li in an amount shown in the formula (6) to a piezoelectric ceramic having an alkali-containing niobate-based perovskite structure, whose Li content at A-sites is higher than 4%. While, if only Si is added to a piezoelectric ceramic having an alkali-containing niobate-based perovskite structure, whose Li content at A-sites is higher than 4%, sintering is difficult.

Figure 6:
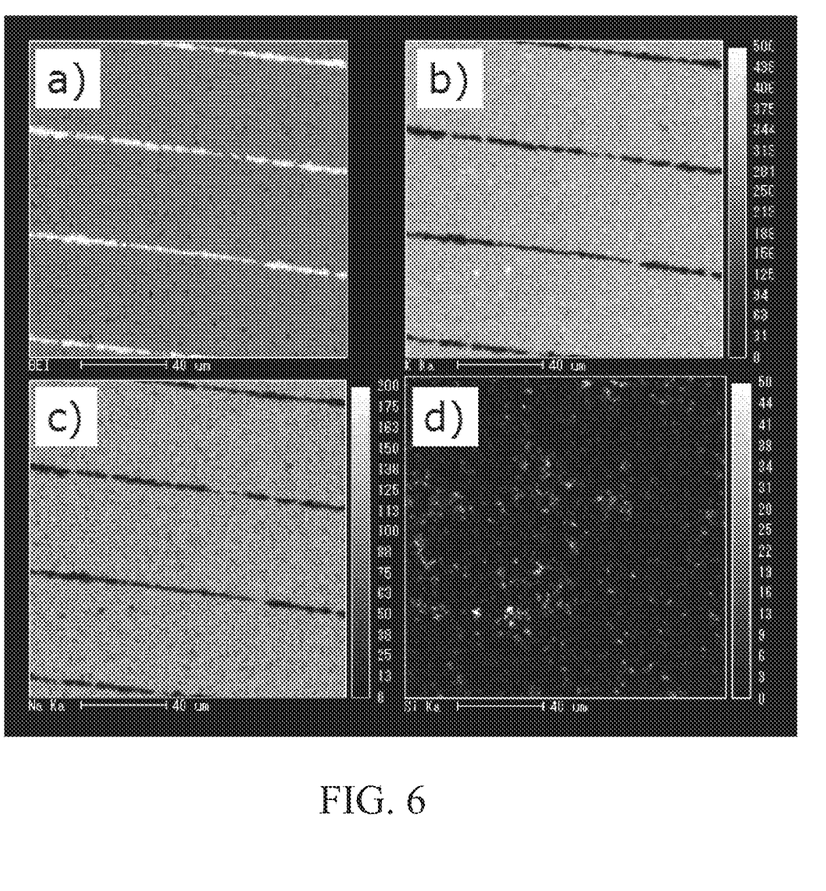
FIG. 6 is backscattered electron images and compositional images concerning a piezoelectric ceramic according to an embodiment of the present invention.

Further, the distribution of the internal composition of a piezoelectric ceramic according to the present invention was evaluated using an EPMA (Electron probe microanalyzer) (see FIG. 6 related to Example 2 described below). As the result, it could be confirmed that a crystal phase or an amorphous phase containing an alkali component potassium (K) and silicon (Si) was deposited at a grain boundary or a grain boundary triple point of a plurality of crystal grains constituting a base substance of a piezoelectric ceramic. The average grain size of the crystal grains was in a range of 1 to 5 μm. Meanwhile, a piezoelectric ceramic with the Li content at A-sites of 4% or less was observed similarly. As the result, with respect to a sintered body of a piezoelectric ceramic with the Li content at A-sites of 4% or less, a crystal phase containing silicon was deposited on the surface thereof inhomogeneously, and the average grain size of the crystal grains was 5 μm or more. From the observation results, it was judged that a piezoelectric ceramic with the Li content at A-sites of 4% or less was of no practical use.

As described above, by having a crystal phase or an amorphous phase containing Si and K deposited at a grain boundary or a grain boundary triple point of a plurality of crystal grains constituting a piezoelectric ceramic having as a main component an alkali-containing niobate-based perovskite structure expressed by a compositional formula $(Li_xNa_yK_{1-x-y})a(Nb_{1-z}Ta_z)O_3$ (provided: 0.04<x≤0.1, 0≤y≤1, 0≤z≤0.4, and 0.95≤a≤1.005), the average grain size of the crystal grains can be made in a range of 1 to 5 μm. By doing so, the sintering property of the piezoelectric ceramic can be improved. Additionally, the piezoelectric ceramic can have a good piezoelectric property and resistance property.

According to an embodiment of the present invention, 2 mol % or less of M2O (provided that M2 is at least one kind of element selected from the group consisting of Ca, Ba, and Sr) can be mixed with 100 mol of a piezoelectric ceramic having an alkali-containing niobate-based perovskite structure as the main component as shown in the formula (9). In this case, a defect at an A-site to be generated, when a monovalent alkali metal element is vaporized, can be compensated by a bivalent alkaline-earth metal element so as to neutralize the overall valence. Further, also an oxygen vacancy to be generated, when a monovalent alkali metal element is vaporized, can be compensated by introducing oxygen. As the result, it is believed that the deterioration of dielectric loss can be suppressed.

According to an embodiment of the present invention, 2 mol % or less of $ZrO_2$ can be mixed with 100 mol of piezoelectric ceramic having an alkali-containing niobate-based perovskite structure as the main component as shown in the formula (10). In this case, since a tetravalent cation exists in a base substance, conversion of Nb to tetravalent by an oxygen vacancy to be generated by evaporation of an alkali metal element can be suppressed. As the result, it is believed that an electron conductive action of a ceramic can be suppressed.

According to an embodiment of the present invention, 2 mol % or less of MnO can be mixed with 100 mol of piezoelectric ceramic having an alkali-containing niobate-based perovskite structure as the main component as shown in the formula (11). In this case, since Mn, which can easily cause valence fluctuation, exists in a base substance, even if an oxygen vacancy is generated by evaporation of an alkali metal element, it is believed that the overall electric charge can be easily maintained neutral.

The present inventors have confirmed that, even if two or more kinds of the aforedescribed M2O, $ZrO_2$, and MnO are added within the range according to the formulas (9) to (11), a similar improving effect on a specific resistance value can be obtained as one kind of the elements is added.

According to an embodiment of the present invention, by mixing a certain amount of at least one kind of element selected from the group consisting of Sc, Ti, V, Cr, Fe, Co, Ni, Cu, and Zn, which are the first transition elements, with a piezoelectric ceramic expressed by the compositional formula (i), the sintering temperature of the piezoelectric ceramics can be regulated, so as to regulate the growth of a grain, and/or to prolong the life duration in a higher electric field.

Further, according to an embodiment of the present invention, by mixing a certain amount of at least one kind of element selected from the group consisting of Y, Zr, Mo, Ru, Rh, and Pd, which are the second transition elements, with a piezoelectric ceramic expressed by the compositional formula (i), the sintering temperature of the piezoelectric ceramics can be regulated, so as to regulate the growth of a grain, and/or to prolong the life duration in a higher electric field.

Further, according to an embodiment of the present invention, by mixing a certain amount of at least one kind of element selected from the group consisting of La, Ce, Pr, Nd, Sm, Eu, Gd, Tb, Dy, Ho, Er, Tm, Yb, Lu, Hf, W, Re, Os, Ir, Pt, and Au, which are the third transition elements, with a piezoelectric ceramic expressed by the compositional formula (i), the sintering temperature of the piezoelectric ceramics can be regulated, so as to regulate the growth of a grain, and/or to prolong the life duration in a higher electric field.

According to an embodiment of the present invention, the aforedescribed first transition elements, second transition elements, and third transition elements can be mixed together.

Figure 2:
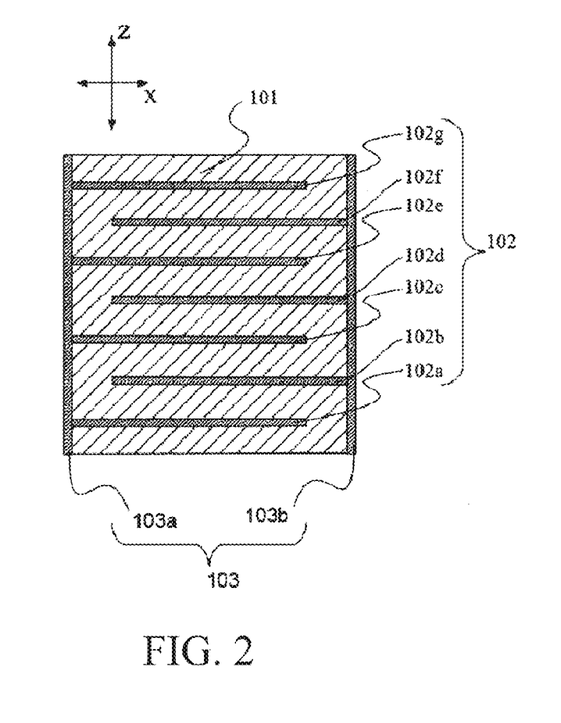
FIG. 2 is a sectional view of a multi-layer piezoelectric actuator according to an embodiment of the present invention.

Next, a multi-layer piezoelectric ceramic element to be produced using a piezoelectric ceramic according to an embodiment of the present invention will be described. FIG. 2 shows a multi-layer piezoelectric ceramic element according to an embodiment of the present invention. The multi-layer piezoelectric ceramic element is as illustrated a multi-layer piezoelectric actuator. The multi-layer piezoelectric actuator comprises a piezoelectric ceramic layer (101) and a plurality of internal electrodes (102) having been laminated intercalating a piezoelectric ceramic layer (101). A plurality of external electrodes (103) connected electrically with any one of the internal electrodes (102) are formed on outer surfaces of the piezoelectric ceramic (101). As illustrated, in the multi-layer piezoelectric actuator, first electrodes (102a, 102c, 102e, 102g) and second electrodes (102b, 102d, 102f) are stacked alternately intercalating a piezoelectric ceramic layer (101). In this case, the first electrodes are connected electrically with a first terminal electrode (103a), and the second electrodes are connected electrically with a second terminal electrode (103b). The first electrodes and the second electrodes are formed mainly by a metal, such as Pt, Pd, and Ag. If voltage is applied between the first terminal electrode and the second terminal electrode, the multi-layer piezoelectric actuator can move along the Z-axis in the figure.

Figure 3:
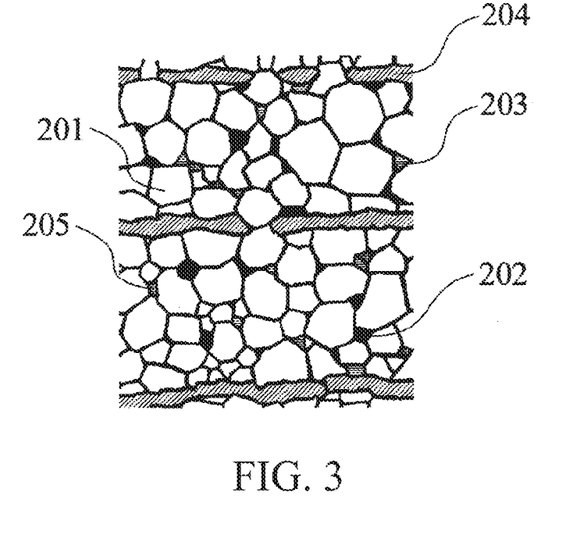
FIG. 3 is a schematic diagram showing a microscopic structure of a multi-layer piezoelectric ceramic element according to an embodiment of the present invention.

FIG. 3 is a schematic diagram showing a microscopic structure of an internal electrode and a piezoelectric ceramic layer of a multi-layer piezoelectric ceramic element according to an embodiment of the present invention. A piezoelectric ceramic layer shown in FIG. 3 is constituted of piezoelectric ceramics crystal grains (201) having an alkali-containing niobate-based perovskite structure, first subphase grains (202) composed of a crystal phase or an amorphous phase containing K and Si, and second subphase grains (203) composed of a crystal phase different from the first subphase grain. The first and second subphase grains exist at a grain boundary or a grain boundary triple point of a plurality of piezoelectric ceramic crystal grains. As illustrated, between each layer of a plurality of piezoelectric ceramic layers, an internal electrode (204) with the thickness of 0.5 to 2 μm is provided. As described above, a multi-layer piezoelectric ceramic element according to an embodiment of the present invention has a laminate structure. Further, a vacant part (205) may exist in the piezoelectric ceramic layer. The piezoelectric ceramics crystal grain (201) has an $ABO_3$-type alkali-containing niobate-based perovskite structure as described above.

An oxide such as M2O, $ZrO_2$, and MnO contained in a piezoelectric ceramic according to an embodiment of the present invention is incorporated by firing into a periodic structure of a piezoelectric ceramic having an alkali-containing niobate-based perovskite structure. As the result, the aforedescribed valence fluctuation can be suppressed; and oxygen vacancy in a piezoelectric ceramic can be suppressed, because the piezoelectric ceramic comes close to electrical neutrality.

The first subphase grain composed of a crystal phase or an amorphous phase containing K and Si is for example composed of a crystal phase or an amorphous phase containing K, Si, Nb, and O, such as $K_3Nb_3O_6Si_2O_7$, and $KNbSi_2O_7$. Further, according to an embodiment, the first subphase grain may be composed of a crystal phase or an amorphous phase containing K, Li, Si, and O, such as $K_3LiSiO_4$, and $KLi_3SiO_4$. Further, according to another embodiment, the first subphase grain may be composed of a crystal phase or an amorphous phase containing K, Si, and O, such as $K_2Si_4O_9$, $K_6Si_3O_9$, $K_2Si_4O_9$, and $K_4SiO_4$. The first subphase grain may contain one, or two or more crystal phases expressed by the above compositional formulas, and/or, similarly, one, or two or more amorphous phases expressed by the above compositional formulas. As described above, according to embodiments of the present invention, the first subphase grain may have various crystal phases or amorphous phases containing K and Si.

According to an embodiment of the present invention, the second subphase grain contains a crystal phase of a tungsten bronze structure expressed by a compositional formula, such as $K_3Li_2Nb_5O_{15}$, $K_{5.75}Nb_{10.85}O_{30}$, and $K_3LiNb_6O_{17}$. According to another embodiment, the second subphase grain may be composed of a crystal phase containing Li, Nb, and O expressed by a compositional formula, such as $LiNbO_3$, and $Li_3NbO_4$. Further, according to another embodiment, the second subphase grain may be composed of a crystal phase or an amorphous phase containing Mn and O expressed by a compositional formula, such as $MnO$, $Mn_2O_3$, and $MnO_2$. The second subphase grain may contain one, or two or more crystal phases expressed by the above compositional formulas, and/or, similarly, one, or two or more amorphous phases expressed by the above compositional formulas.

Next, a production process of a multi-layer piezoelectric actuator according to an embodiment of the present invention will be described. A multi-layer piezoelectric actuator is a kind of laminated ceramic elements according to an embodiment of the present invention.

A piezoelectric ceramic having an alkali-containing niobate-based perovskite structure, which will constitute a main component of a piezoelectric ceramic layer, is synthesized as follows. Firstly, as source materials for a piezoelectric ceramic having an alkali-containing niobate-based perovskite structure, a source material containing potassium (K), a source material containing sodium (Na), a source material containing lithium (Li), a source material containing niobium (Nb) and a source material containing tantalum (Ta) are prepared. Examples of the source material containing potassium include potassium carbonate ($K_2CO_3$) and potassium hydrogencarbonate ($KHCO_3$). Examples of the source material containing sodium include sodium carbonate ($Na_2CO_3$) and sodium hydrogencarbonate ($NaHCO_3$). Examples of the source material containing lithium include lithium carbonate ($Li_2CO_3$). Examples of the source material containing niobium include niobium pentoxide ($Nb_2O_5$). Examples of the source material containing tantalum include tantalum pentoxide ($Ta_2O_5$).

The prepared source materials are weighed so as to satisfy the formula (1) to formula (4). Then, the respective weighed source materials were charged into a ball mill provided with partially stabilized zirconia (PSZ) balls and agitated in a wet state in the presence of an organic solvent such as ethanol for 10 to 60 hours. After the agitation, the organic solvent is vaporized for drying to yield an agitated source material. The yielded agitated source materials are calcined at a temperature of 700 to 950° C. for 1 to 10 hours to yield a calcined substance. The calcined substance is then disintegrated by a ball mill to yield calcined powder.

Next, a source material containing lithium, a source material containing silicon (Si), a source material containing M2 (provided that M2 is at least one kind of element selected from the group consisting of calcium (Ca), barium (Ba), and strontium (Sr)), a source material containing zirconium (Zr) and a source material containing manganese (Mn) are prepared. Then, the respective prepared source materials are weighed so as to satisfy the formula (5) to formula (11). Then, the respective weighed source materials together with the above calcined powder are agitated by a ball mill provided with PSZ balls in a wet state in the presence of an organic solvent such as ethanol for 10 to 60 hours. After the agitation, the organic solvent is vaporized for drying to yield a calcined powder mixture.

Examples of the source material containing silicon include silicon oxide ($SiO_2$). Examples of the source material containing calcium include calcium carbonate ($CaCO_3$). Examples of the source material containing barium include barium carbonate ($BaCO_3$). Examples of the source material containing strontium include strontium carbonate ($SrCO_3$). Examples of the source material containing zirconium include zirconium oxide ($ZrO_2$). Examples of the source material containing manganese (Mn) include manganese carbonate ($MnCO_3$), manganese monoxide (MnO), manganese dioxide ($MnO_2$), trimanganese tetroxide ($Mn_3O_4$), and manganese acetate ($Mn(OCOCH_3)_2$).

A source material containing two or more kinds of elements may be used. For example, lithium metasilicate ($Li_2SiO_3$), lithium orthosilicate ($Li_4SiO_4$), and the like containing lithium and silicon can be used as a source material for lithium and silicon. Further, calcium metasilicate ($CaSiO_3$), calcium orthosilicate ($Ca_2SiO_4$), and the like containing calcium and silicon can be used as a source material for calcium and silicon. Further, calcium zirconate ($CaZrO_3$) containing calcium and zirconium, barium zirconate ($BaZrO_3$) containing barium and zirconium, and strontium zirconate ($SrZrO_3$) containing strontium and zirconium can also be used.

Figure 4:
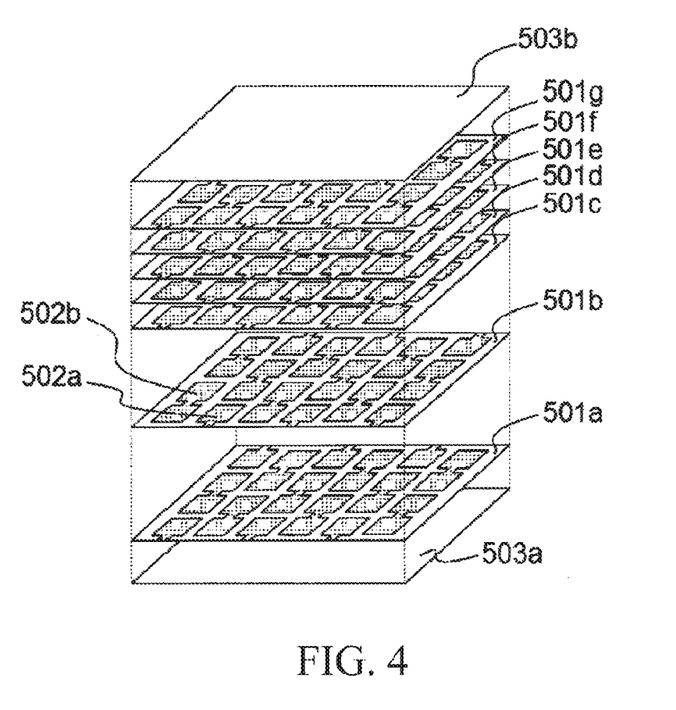
FIG. 4 is a perspective view showing a part of a production process of a multi-layer piezoelectric actuator according to an embodiment of the present invention.

Next, to the calcined powder mixture yielded according to the above procedure, an organic binder and a dispersant are added and the mixture is blended by a ball mill in a wet state in the presence of pure water or an organic solvent such as ethanol to yield a ceramics slurry. The ceramics slurry is subjected to forming by a doctor blade process, etc. to yield a ceramic green sheet. Then, as shown in FIG. 4, conductive patterns (502a) with a half-dumbbell shape and conductive patterns (502b) with a dumbbell shape are screen-printed on the ceramic green sheets (501a to 501g) with an electroconductive paste containing Pt, Pd, Ag, etc. as a main component.

Next, the ceramics green sheets (501a to 501g), on which the conductive layer pattern has been formed, are laminated alternately to form a laminate, and onto the upper surface and the lower surface of the laminate, ceramic green sheets (503a, 503b) without the conductive layer pattern are fixed by pressing to obtain a ceramic laminate, in which a conductive layer pattern and a ceramic green sheet (501a to 501g) are laminated alternately.

Then, the obtained ceramic laminate is cut into a predetermined shape, and the cut ceramic laminate is put into, for example, an alumina sheath, subjected to a binder removal treatment at 300° C. to 500° C., and then fired in the atmosphere at 900° C. to 1050° C. According to the above procedure, a ceramics sintered body having the microscopic structure shown in FIG. 3 can be produced.

Figure 5:
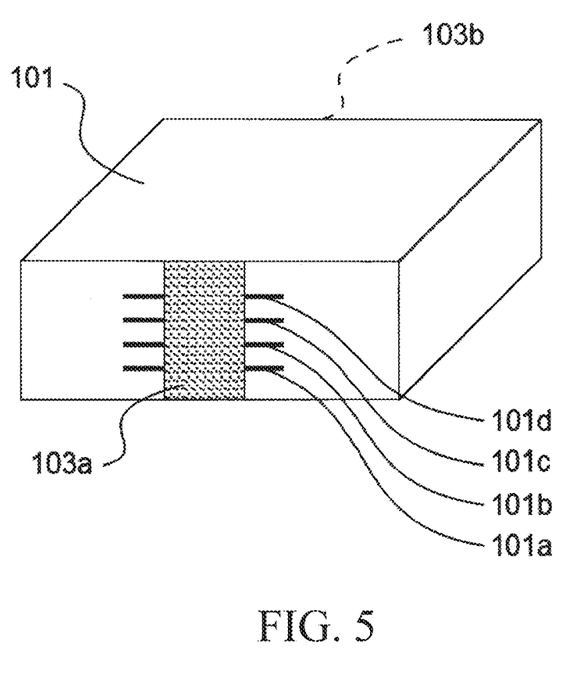
FIG. 5 is a perspective view of a multi-layer piezoelectric actuator according to an embodiment of the present invention.

Next, to both sides of the produced ceramic sintered body, where internal electrodes are exposed, an electroconductive paste with Ag, etc. as a main component is applied, and subjected to a baking treatment at 750° C. to 850° C. to form external electrodes (103a, 103b) as shown in FIG. 5. By applying voltage between the external electrodes (103a and 103b) for carrying out a poling treatment, a multi-layer piezoelectric actuator can be obtained. The external electrodes (103a, 103b) can be also formed by a thin-film formation process, such as a sputtering process and a vacuum evaporation process.

The main component of a piezoelectric ceramic layer of the thus produced multi-layer piezoelectric actuator is expressed by the compositional formula (i). The multi-layer piezoelectric actuator exhibits a good piezoelectric property and is superior in reliability. Further, the multi-layer piezoelectric actuator can be fired at a low temperature. As described above, a multi-layer piezoelectric actuator according to the present invention has adequate performance for replacing a piezoelectric ceramic element with PZT as a main component.

EXAMPLES

Examples of the present invention will be described below. The examples are given for the purpose of illustrating the invention and are not meant to limit the present invention thereto.

Example 1

A plurality of samples, in which the values of $\alpha$, $\beta$, m, n, and l in the compositional formula (i) are different, were produced and the properties of the samples were evaluated.

First, $K_2CO_3$, $Na_2CO_3$, $Li_2CO_3$, and $Nb_2O_5$ were prepared as source materials for a piezoelectric ceramic having an alkali-containing niobate-based perovskite structure, which should constitute a main phase. Alkali carbonates were dried in advance at 200° C. for 12 hours or longer. Then, the source materials were weighed, such that the composition after calcination should become $Li_{0.06}Na_{0.52}K_{0.42}NbO_3$ (namely, to satisfy x=0.06, y=0.52, z=0.0, and a=1.0). Then, the respective weighed source materials were blended by a wet ball mill process using PSZ balls in the presence of an ethanol solvent for 15 hours. Then, the obtained blend was dried at 100° C. to evaporate thoroughly ethanol, and thereafter calcined at 900° C. to obtain a calcined substance.

The calcined substance was disintegrated to obtain calcined powder. Then, to the calcined powder $Li_2CO_3$, $SiO_2$, $CaCO_3$, $BaCO_3$, $SrCO_3$, $ZrO_2$, and $MnCO_3$ were added respectively in the amounts set forth in Table 1, and blended by a ball mill in a wet phase in the presence of an ethanol solvent for 24 hours. Then, the blend was dried at 100° C. to obtain a calcined powder mixture. Then, to the calcined powder mixture, an organic binder and a dispersant were added, and the mixture was blended in a ball mill to yield a ceramics slurry. Then, the yielded slurry was formed by a doctor blade process to yield a ceramics green sheet with the thickness of 100 μm.

Next, a plurality of the ceramic green sheets were laminated to yield a laminate with the thickness of approx. 0.6 mm. Then, the laminate was pressed uniaxially under conditions of 70° C., and 100 MPa. Then, the pressed laminate was cut in a 10-mm-diameter disk shape to yield a ceramic compact. Then, the yielded ceramic compact was heated at 500° C. for about 3 hours to remove organic components in the compact thoroughly, and then fired at a temperature from 900 to 1100° C. for 2 hours to produce a disk-shaped piezoelectric ceramic. Then, on the two opposing surfaces of the piezoelectric ceramic, Ag electrodes were formed respectively by baking Ag at 800° C., to obtain the respective samples listed as Sample No. 1 through Sample No. 29 in Table 1.

To the respective yielded samples of No. 1 to No. 29, the electric field of 3.0 kV/mm was applied in a silicone oil at 100° C. for 15 min for conducting a poling treatment on the respective samples of No. 1 to No. 29. The respective samples thus subjected to the poling treatment were left standing overnight at room temperature. For the respective samples left standing overnight, dielectric loss (tan δ), dielectric constant ($\in_{33}^T/\in_0$), kp, and piezoelectric constant ($d_{31}$) were measured. For the measurements, an impedance analyzer was used to determine dielectric loss (tan δ) and dielectric constant ($\in_{33}^T/\in_0$) at a signal frequency of 1 kHz. The $\in_{33}^T/\in_0$ was determined based on a measured value of capacitance and the dimension of the sample. The kp and $d_{31}$ were calculated by a resonance-antiresonance method according to "Electrical test methods for piezoelectric ceramic vibrators" described in JEITA EM-4501.

Next, for the respective samples of No. 1 to No. 29, specific insulation resistance (ρ) was measured at room temperature (25° C.) and 150° C. respectively using a DC ampere/volt meter by a 2-terminal method, and logarithm of the measured specific insulation resistance log(ρ/Ω·cm) was calculated. The specific insulation resistance was evaluated using the amperage after applying an electric field of 2 kV/mm for 60 sec on the respective samples. If the logarithm of specific insulation resistance log(ρ/Ω·cm) is 13 or higher, as the measured amperage is small, it is expressed as "13 or higher" in Table 2.

When the $\in_{33}^T/\in_0$ was 500 or higher, kp was 38% or higher, the absolute value of piezoelectric constant ($d_{31}$) was 55 pC/N or higher, logarithm of specific insulation resistance log(ρ/Ω·cm) at room temperature was 11 or higher, logarithm of specific insulation resistance at 150° C. was 8 or higher, and sintering was possible at 1050° C. or less, the sample was judged as an acceptable article.

The measurement results of dielectric loss (tan δ), dielectric constant ($\in_{33}^T/\in_0$), kp, and piezoelectric constant ($d_{31}$) for the respective samples are summarized in Table 2.

TABLE 1

| Sample No. | 100 $(Li_{0.06}Na_{0.52}K_{0.42})NbO_3$ + α $Li_2O$ + β $SiO_2$ + m M2O + n $ZrO_2$ + l MnO | | | | | |
|---|---|---|---|---|---|---|
| | M2 | α | β | m | n | l |
| ※1 | — | 0 | 0 | 0 | 0 | 0.0 |
| ※2 | — | 0 | 1.4 | 0 | 0 | 0.0 |
| 3 | — | 0.7 | 1.4 | 0 | 0 | 0.0 |
| 4 | — | 0.7 | 1.4 | 0 | 0 | 0.2 |
| 5 | — | 0.7 | 1.4 | 0 | 0 | 0.5 |
| 6 | — | 0.7 | 1.4 | 0 | 0 | 1.0 |
| 7 | — | 0.7 | 1.4 | 0 | 0 | 2.0 |
| ※8 | — | 0.7 | 1.4 | 0 | 0 | 4.0 |
| ※9 | — | 0.4 | 1.4 | 0 | 0 | 0.2 |
| 10 | — | 0.5 | 1.4 | 0 | 0 | 0.2 |
| 11 | — | 0.9 | 1.4 | 0 | 0 | 0.2 |
| ※12 | — | 1.0 | 1.4 | 0 | 0 | 0.2 |
| ※13 | — | 0.1 | 0.2 | 0 | 0 | 0.2 |

TABLE 1-continued

Sample $100 (Li_{0.06}Na_{0.52}K_{0.42})NbO_3 + \alpha Li_2O + \beta SiO_2 + m M2O + n ZrO_2 + I MnO$

| No. | M2 | α | β | m | n | I |
|---|---|---|---|---|---|---|
| 14 | — | 0.2 | 0.4 | 0 | 0 | 0.2 |
| 15 | — | 1.0 | 2.0 | 0 | 0 | 0.2 |
| 16 | — | 1.5 | 3.0 | 0 | 0 | 0.2 |
| ✗17 | — | 2.0 | 4.0 | 0 | 0 | 0.2 |
| 18 | Sr | 0.7 | 1.4 | 0.2 | 0.2 | 0.2 |
| 19 | Sr | 0.7 | 1.4 | 0.5 | 0.5 | 0.2 |
| 20 | Sr | 0.7 | 1.4 | 1.0 | 1.0 | 0.2 |
| 21 | Sr | 0.7 | 1.4 | 2.0 | 2.0 | 0.2 |
| ✗22 | Sr | 0.7 | 1.4 | 5.0 | 5.0 | 0.2 |
| 23 | Sr | 0.7 | 1.4 | 0.5 | 0.6 | 0.2 |
| 24 | — | 0.7 | 1.4 | 0.0 | 0.5 | 0.2 |
| 25 | Sr | 0.7 | 1.4 | 0.5 | 0.5 | 0.0 |
| 26 | Ca | 0.7 | 1.4 | 0.5 | 0.5 | 0.0 |
| 27 | Ca | 0.7 | 1.4 | 0.5 | 0.5 | 0.2 |
| 28 | Ba | 0.7 | 1.4 | 0.5 | 0.5 | 0.0 |
| 29 | Ba | 0.7 | 1.4 | 0.5 | 0.5 | 0.2 |

TABLE 2

| Sample No. | Firing Temp. (° C.) | Dielectric. Const $\epsilon_{33}^T/\epsilon_0$ | Dielectric Loss tanδ (%) | Electromechanical Coupling Const. k p (%) | Piezoelectric Const. $d_{31}$ (pC/N) | Logarithm of Specific Insulation Resistance at Room Temp. log (ρ/Ω·cm) | Logarithm of Specific Insulation Resistance at 150° C. log (ρ/Ω·cm) |
|---|---|---|---|---|---|---|---|
| ✗1 | 1080 | 930 | 4.5 | 45 | −82 | 12.0 | 8.4 |
| ✗2 | 1120 | 480 | 4.3 | 40 | −49 | 8.9 | — |
| 3 | 1000 | 915 | 4.1 | 43 | −80 | 12.8 | 9.5 |
| 4 | 990 | 830 | 3.9 | 41 | −73 | ≥13 | 10.2 |
| 5 | 990 | 720 | 2.4 | 40 | −67 | ≥13 | 10.3 |
| 6 | 990 | 660 | 2.0 | 39 | −62 | ≥13 | 10.3 |
| 7 | 980 | 580 | 3.1 | 38 | −56 | 11.2 | 9.1 |
| ✗8 | 980 | — | — | — | — | 7.9 | — |
| ✗9 | 1050 | 590 | 4.3 | 41 | −56 | 10.5 | — |
| 10 | 1020 | 850 | 4.4 | 41 | −60 | 12.7 | 9.5 |
| 11 | 990 | 860 | 4.2 | 41 | −74 | 12.5 | 9.4 |
| ✗12 | 990 | — | — | — | — | 7.5 | — |
| ✗13 | 1100 | 930 | 4.8 | 45 | −85 | 12.0 | 9.5 |
| 14 | 1050 | 920 | 4.3 | 44 | −82 | 12.2 | 9.8 |
| 15 | 980 | 885 | 4.1 | 40 | −74 | 12.5 | 10.0 |
| 16 | 970 | 710 | 4.2 | 38 | −62 | 12.3 | 9.1 |
| ✗17 | 970 | 540 | 4.5 | 31 | −39 | 11.8 | 8.5 |
| 18 | 1000 | 895 | 2.0 | 42 | −74 | ≥13 | 10.7 |
| 19 | 1010 | 880 | 1.9 | 42 | −74 | ≥13 | 10.3 |
| 20 | 1010 | 850 | 1.8 | 41 | −73 | ≥13 | 9.5 |
| 21 | 1020 | 785 | 1.8 | 39 | −68 | ≥13 | 8.9 |
| ✗22 | 1040 | 620 | 2.5 | 35 | −55 | 12.5 | 7.3 |
| 23 | 1000 | 880 | 1.8 | 42 | −74 | ≥13 | 10.6 |
| 24 | 1010 | 880 | 1.5 | 42 | −71 | ≥13 | 9.4 |
| 25 | 1010 | 980 | 4.1 | 40 | −75 | ≥13 | 8.8 |
| 26 | 1010 | 950 | 3.8 | 39 | −71 | 12.6 | 8.5 |
| 27 | 1010 | 890 | 3.2 | 39 | −69 | ≥13 | 9.9 |
| 28 | 1010 | 940 | 4.5 | 40 | −73 | 12.4 | 9.2 |
| 29 | 1010 | 900 | 3.5 | 39 | −68 | ≥13 | 9.1 |

As shown in Table 2, since the firing temperature for Sample No. 1 is as high as 1080° C., if Pt, Pd, or Ag is used as an internal electrode material, the electrode may possibly react with the piezoelectric ceramic during firing, and therefore a good piezoelectric property and specific insulation resistance can be hardly attained.

Sample No. 2 has a poor sintering property and the dielectric constant is 480 and extremely low compared to Sample No. 1. Further, logarithm of the specific insulation resistance log(ρ/Ω·cm) at room temperature is also as low as 8.9.

With respect to Sample No. 8, since logarithm of the specific insulation resistance log(ρ/Ω·cm) at room temperature is as small as 7.9, it cannot be polarized, and therefore does not function as a piezoelectric ceramic.

With respect to Sample No. 9, logarithm of the specific insulation resistance log(ρ/Ω·cm) at room temperature was as small as 10.5, and logarithm of the specific insulation resistance log(ρ/Ω·cm) at 150° C. could not be measured.

With respect to Sample No. 12, since logarithm of the specific insulation resistance log(ρ/Ω·cm) at room temperature is as small as 7.5, it cannot be polarized, and therefore does not function as a piezoelectric ceramic.

With respect to Sample No. 13, the piezoelectric property is good and logarithm of the specific insulation resistance log(ρ/Ω·cm) is also sufficiently high. However, since the firing temperature is as high as 1100° C., if Pt, Pd, or Ag is used as an internal electrode material, the electrode may possibly react with the piezoelectric ceramic during firing, and therefore a good piezoelectric property and specific insulation resistance can hardly be obtained.

With respect to Sample No. 17, the kp is as small as 31%, and the absolute value of the piezoelectric property ($d_{31}$) is as small as 39 pC/N.

Samples No. 3 to No. 7, No. 10, No. 11, and No. 14 to No. 16 exhibit a good piezoelectric property and is superior in reliability, and firing at a low temperature is possible for them. Consequently, such samples have adequate performance for replacing a piezoelectric ceramic with Pb as a main component.

As obvious from the measurement results with respect to Samples No. 4 to No. 6, if MnO was contained in a range of 0.2 to 1.0 mol with respect to 100 mol of the main component, adequately high logarithm of the specific insulation resistance $\log(\rho/\Omega\cdot cm)$ was obtained at room temperature as well as at 150° C.

With respect to Samples No. 18 to 21, 0.2 to 2.0 mol of SrO and 0.2 to 2.0 mol of $ZrO_2$ are contained with respect to 100 mol of the main component. As obvious from Table 2, it could be confirmed that Samples No. 18 to 21 were superior piezoelectric ceramics with low dielectric loss. Sample No. 22 contains 5.0 mol of $SrO_2$ with respect to 100 mol of the main component. The dielectric loss of Sample No. 22 is higher compared to Samples No. 18 to 21 having a low content of $ZrO_2$, and its kp is as extremely low as 35%.

Sample No. 23 is different from Sample No. 19, in that the former does not contain $ZrO_2$. As seen from Table 2, Sample No. 23 was confirmed to be an acceptable article. In other words, it was confirmed that Sample No. 23 had adequate performance for replacing a piezoelectric ceramic with Pb as a main component.

Sample No. 24 is different from Sample No. 19, in that the former does not contain SrO. As seen from Table 2, Sample No. 24 was confirmed to be an acceptable article. In other words, it was confirmed that Sample No. 24 had adequate performance for replacing a piezoelectric ceramic with Pb as a main component.

Sample No. 25 is different from Sample No. 19, in that the former does not contain MnO. As seen from Table 2, Sample No. 25 was confirmed to be an acceptable article. In other words, it was confirmed that Sample No. 25 had adequate performance for replacing a piezoelectric ceramic with Pb as a main component.

Sample No. 26 contains Ca as an M2 element. As seen from Table 2, Sample No. 26 was confirmed to be an acceptable article. In other words, it was confirmed that Sample No. 26 had adequate performance for replacing a piezoelectric ceramic with Pb as a main component.

Sample No. 27 contains 0.2 mol of MnO with respect to 100 mol of the main component in addition to the composition of Sample No. 26. As seen from Table 2, Sample No. 27 was confirmed to be an acceptable article. In other words, it was confirmed that Sample No. 27 had adequate performance for replacing a piezoelectric ceramic with Pb as a main component.

Further, Samples No. 28 and No. 29 contain Ba as an M2 element. As seen from Table 2, Samples No. 27 and No. 28 were confirmed to be acceptable articles. In other words, it was confirmed that Samples No. 27 and No. 28 had adequate performance for replacing a piezoelectric ceramic with Pb as a main component.

From the above, it could be confirmed that a piezoelectric ceramic satisfying the compositional formula (i) can be fired at 1050° C. or lower. Further, it could be confirmed that a piezoelectric ceramic satisfying the compositional formula (i) can have good piezoelectric properties with $\in_{33}^T/\in_0$ of 500 or higher, kp of 38% or higher, and the absolute value of the piezoelectric constant ($d_{31}$) of 55 pC/N or higher. Further, it could be confirmed that a piezoelectric ceramic satisfying the compositional formula (i) has logarithm of the specific insulation resistance $\log(\rho/\Omega\cdot cm)$ at room temperature of 11 or higher and logarithm of the specific insulation resistance $\log(\rho/\Omega\cdot cm)$ at 150° C. of 8 or higher.

Example 2

In Example 2, using three kinds of piezoelectric ceramics having respectively the same compositions as Sample No. 1 (Comparative Example) as well as Sample No. 3 and Sample No. 18 within the scope of the present invention as described above, multi-layer piezoelectric actuators were produced for trial, and the properties of the trial multi-layer piezoelectric actuators thus produced were evaluated.

According to a procedure similar to that described in Example 1, the respective source materials were weighed, such that piezoelectric ceramics can have respectively the same compositions as Sample No. 1, Sample No. 3, and Sample No. 18 after firing, and using the weighed source materials three kinds of ceramics green sheets with the thickness of 80 μm were produced. Next, with an electroconductive paste composed of Pt a conductive pattern was formed on the ceramic green sheet. Then by laminating the ceramics green sheets with the formed conductive pattern, a laminate was formed, and onto the upper surface and the lower surface of the laminate, ceramic green sheets without the conductive layer pattern were fixed by pressing at a pressure of approx. 50 MPa to obtain a plate-like ceramic laminate.

Next, the plate-like ceramic laminate was cut into a predetermined shape, and the cut ceramic laminate was put into an alumina sheath, and subjected to a binder removal treatment at 300° C. to 500° C. The ceramic laminate having been subjected to the binder removal treatment was fired in the atmosphere at a predetermined firing temperature to obtain a laminated ceramic sintered body. Next, to both end faces of the laminated ceramic sintered body, where internal electrodes were exposed, an electroconductive paste composed of Ag was applied, and subjected to a baking treatment at 800° C. to form external electrodes. Then, a poling treatment was carried out on the laminated ceramic sintered body, on which external electrodes were formed, by applying an electric field of 3.0 kV/mm to the laminated ceramic sintered body in a silicone oil at 100° C. for 15 min. According to the above, three kinds of multi-layer piezoelectric actuators as shown in FIG. 5 were produced. Among the produced multi-layer piezoelectric actuators, the multi-layer piezoelectric actuator provided with a piezoelectric ceramic with the same composition as Sample No. 1 is called as Sample No. 30; the multi-layer piezoelectric actuator provided with a piezoelectric ceramic with the same composition as Sample No. 3 is called as Sample No. 31; and the multi-layer piezoelectric actuator provided with a piezoelectric ceramic with the same composition as Sample No. 18 is called as Sample No. 32.

Next, the piezoelectric constant $d^*_{33}$ under application of a coercive electric field was measured for each of three kinds of the produced multi-layer piezoelectric actuators of Sample No. 30 to Sample No. 32 by applying an electric field of 4.0 kV/mm at room temperature. More particularly, an electric field of 4.0 kV/mm was applied to a sample, the displacement magnitude of the electric field was observed by a laser Doppler displacement meter, and the $d^*_{33}$ (pm/V) was calculated by dividing the displacement magnitude by the number of lamination layers of a measuring object laminate actuator and dividing further the quotient by the applied voltage. The measurement results are summarized in Table 3.

Further, for evaluating the reliability of the produced laminate actuators, an electric field of 8 kV/mm was applied to each of the produced laminate actuators under the respective conditions of room temperature (25° C.), 60° C., and 100° C., and it was examined using a DC ampere/volt meter, whether breakdown by the electric field occurred or not. The examination results are shown in Table 3. "OK" in Table 3 means that no breakdown occurred, and "NG" means that breakdown occurred.

TABLE 3

| Sample No. | Composition | Piezoelectric Const. $d^*_{33}$ (pm/V) | Is 8 kV/mm Applicable at Room Temp? | Is 8 kV/mm Applicable at 60° C.? | Is 8 kV/mm Applicable at 100° C.? |
|---|---|---|---|---|---|
| 30 | Same as Sample No. 1 | 199 | Yes | No | No |
| 31 | Same as Sample No. 3 | 218 | Yes | Yes | No |
| 32 | Same as Sample No. 18 | 235 | Yes | Yes | Yes |

As obvious from Table 3, Sample No. 30 is inferior to Sample No. 31 and Sample No. 32 in terms of the piezoelectric constant $d^*_{33}$. Further, with respect to Sample No. 30 dielectric breakdown occurred at 60° C. and 100° C.

With respect to Sample No. 31 within the scope of the present invention, the piezoelectric constant $d^*_{33}$ is as favorable as 218 pm/V, and dielectric breakdown did not occur even at 60° C. With respect to Sample No. 32 within the scope of the present invention, the piezoelectric constant $d^*_{33}$ is as favorable as 235 pm/V, and dielectric breakdown did not occur even at 60° C. and 100° C.

Three samples of Sample No. 30 to Sample No. 32 were observed by a scanning electron microscope (SEM). From the observation pictures made by the SEM, the average grain size in a piezoelectric ceramic constituting each sample was determined. As the result, the average grain size in the piezoelectric ceramic constituting Sample No. 30 was 7 μm; the average grain size in the piezoelectric ceramic constituting Sample No. 31 was 3 μm; and the average grain size in the piezoelectric ceramic constituting Sample No. 32 was 2.5 μm. Since the average grain sizes in the piezoelectric ceramics constituting Sample No. 31 and Sample No. 32 are small as described above, it is believed that there should exist many crystal grains between the layers of the laminate actuators in the cases of Sample No. 31 and Sample No. 32, and they should have contributed to improvement of the resistance property.

Next, the internal structure of Sample No. 31 was evaluated. Firstly, Sample No. 31 was cut in the thickness direction, and the exposed cut surface was polished by a 3000-grit or higher abrasive paper for smoothing the cut surface. The smoothed cut surface was evaluated by an EPMA. FIG. 6 shows the observation results of the cut surface of Sample No. 31 by an EPMA. FIG. 6a) shows a backscattered electron image of the cut surface of Sample No. 31; FIG. 6b) shows an observation picture with respect to the Kα line of K; FIG. 6c) shows an observation picture with respect to the Kα line of Na; and FIG. 6d) shows an observation picture with respect to the Kα line of Si.

From the observation results it has been confirmed that at a location where the intensity of K is high, the intensity of Si is also high, and reversely the intensity of Na is low. Namely, it has been confirmed that at a location where K is deposited, Si is also deposited. Further, it has been confirmed that the location where K and Si are deposited are a grain boundary or a grain boundary triple point of crystal grains in a piezoelectric ceramic having an alkali-containing niobate-based perovskite structure constituting a main phase of the piezoelectric ceramic. If K and Si are deposited in this manner at a grain boundary or a grain boundary triple point of crystal grains constituting the piezoelectric ceramic, volatile K and Si, which are easily diffused, conceivably react with each other during sintering so as to suppress their diffusion. And, if the diffusion of K and Si is suppressed, grain growth during firing is conceivably suppressed.

Similar observations were made with respect to the samples among those listed in Table 1, which are within the scope of the present invention. As the result, it could be confirmed that K and Si were deposited at a grain boundary or a grain boundary triple point of main phase crystal grains of a piezoelectric ceramic, similarly to the result of Sample No. 31.

What is claimed is:

1. A piezoelectric ceramic comprising: as a main component an alkali-containing niobate-based perovskite structure expressed by a compositional formula $(Li_xNa_yK_{1-x-y})_a(Nb_{1-z}Ta_z)O_3$ (provided: $0.04<x\leq0.1$, $0\leq y\leq 1$, $0\leq z\leq 0.4$, and $0.95\leq a\leq 1.005$);

wherein a crystal phase or an amorphous phase containing Si and K is present at a grain boundary or a grain boundary triple point of a plurality of crystal grains constituting the piezoelectric ceramic.

2. The piezoelectric ceramic according to claim 1, wherein the composition of the crystal phase or the amorphous phase is $K_3Nb_3O_6Si_2O_7$.

3. The piezoelectric ceramic according to claim 1 comprising 0.2 to 3.0 mol % (on mol basis) of $SiO_2$ and 0.1 to 1.5 mol % (on mol basis) of $Li_2O$ with respect to 100 mol % of the main component, and the ratio of ($Li_2O$ in mol)/($SiO_2$ in mol) being in a range of 0.3 to 0.7.

4. The piezoelectric ceramic according to claim 1 comprising 0.0 to 2.0 mol % (on mol basis) of M2O (provided that M2 is at least one kind of element selected from the group consisting of Ca, Ba, and Sr), 0.0 to 2.0 mol % (on mol basis) of $ZrO_2$, and 0.0 to 2.0 mol % (on mol basis) of MnO with respect to 100 mol % of the main component.

5. A piezoelectric ceramic element having a piezoelectric ceramic layer comprising the piezoelectric ceramic according to claim 1, wherein an external electrode is formed on an outer surface of the piezoelectric ceramic layer.

6. A multi-layer piezoelectric ceramic element having piezoelectric ceramic layers comprising the piezoelectric ceramic according to claim 1 and a plurality of internal electrodes disposed inside the piezoelectric ceramic layers, the internal electrodes having been stacked on one another in the thickness direction intercalating the piezoelectric ceramic layer, wherein a plurality of external electrodes connected electrically with any one of the internal electrodes are formed on an outer surface of the piezoelectric ceramic.

* * * * *